(12) United States Patent
Cao et al.

(10) Patent No.: US 10,948,826 B2
(45) Date of Patent: Mar. 16, 2021

(54) PHOTORESIST STRIPPER

(71) Applicant: Versum Materials US, LLC, Tempe, AZ (US)

(72) Inventors: Yuanmei Cao, Tempe, AZ (US); Michael Phenis, Tempe, AZ (US); Richard Peters, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/286,808

(22) Filed: Feb. 27, 2019

(65) Prior Publication Data

US 2019/0278184 A1 Sep. 12, 2019

Related U.S. Application Data

(60) Provisional application No. 62/639,962, filed on Mar. 7, 2018.

(51) Int. Cl.

| | | |
|---|---|---|
| *C11D 7/50* | (2006.01) | |
| *G03F 7/42* | (2006.01) | |
| *H01L 21/311* | (2006.01) | |
| *C11D 7/26* | (2006.01) | |
| *C11D 7/32* | (2006.01) | |
| *C11D 11/00* | (2006.01) | |

(52) U.S. Cl.
CPC ........ *G03F 7/425* (2013.01); *H01L 21/31133* (2013.01); *C11D 7/263* (2013.01); *C11D 7/3209* (2013.01); *C11D 7/3218* (2013.01); *C11D 7/5022* (2013.01); *C11D 11/0047* (2013.01)

(58) Field of Classification Search
CPC .................................................. C11D 11/0047
USPC .......................................................... 510/175
See application file for complete search history.

(56) References Cited

U.S. PATENT DOCUMENTS

2009/0036344 A1 2/2009 Pollard et al.
2016/0152930 A1* 6/2016 Egbe ...................... G03F 7/425
510/176

FOREIGN PATENT DOCUMENTS

| EP | 0723205 A1 | 7/1996 |
|---|---|---|
| EP | 1031884 A2 | 8/2000 |
| EP | 1619557 A1 | 1/2006 |
| WO | 2014089908 A1 | 6/2014 |

* cited by examiner

*Primary Examiner* — Gregory E Webb
(74) *Attorney, Agent, or Firm* — William T. Slaven, IV

(57) ABSTRACT

Improved stripper solutions for removing photoresists from substrates are provided that typically have flash points above about 95° C. and high loading capacities. The stripper solutions comprise diethylene glycol butyl ether, quaternary ammonium hydroxide, and an alkanolamine having at least two carbon atoms, at least one amino substituent and at least one hydroxyl substituent, the amino and hydroxyl substituents attached to two different carbon atoms. Some formulations can additionally contain a secondary solvent. The formulations do not contain DMSO. Methods for use of the stripping solutions are additionally provided.

21 Claims, No Drawings

PHOTORESIST STRIPPER

CROSS REFERENCE TO RELATED APPLICATIONS

This application claims priority under 35 U.S.C. § 119(e) to U.S. provisional patent application No. 62/639,962, filed on Mar. 7, 2018, the entirety of which is incorporated herein by reference.

FIELD OF THE INVENTION

The present invention relates generally to compositions having the ability to effectively remove photoresists from substrates, and to methods for using such compositions. The compositions disclosed are stripper solutions for the removal of photoresists that have the ability to remain liquid at temperatures below normal room temperature and temperatures frequently encountered in transit and warehousing, have flashpoints well above normal processing temperatures, and additionally have compatibility with polymeric dielectric materials.

BRIEF DESCRIPTION OF THE INVENTION

In one aspect of the present invention there are provided photoresist stripper solutions (also referred to as compositions) for effectively removing or stripping a positive or negative photoresist, photoresist after an etch process, or etch residue from a substrate. The inventive stripper solutions have particularly high loading capacities for the resist material, and the ability to remain a liquid when subjected to temperatures below normal room temperature that are typically encountered in transit, warehousing and in use in some manufacturing facilities. The compositions have flashpoints above 95° C. More preferred formulations have flashpoints greater than or equal to 99° C. The compositions have freezing points sufficiently below 0° C. to minimize solidification during transportation and warehousing. More preferred formulations have freezing points below about −10° C.

The compositions according to the present disclosure typically contain diethylene glycol butyl ether (DB), a quaternary ammonium hydroxide, and an alkanolamine or a secondary solvent or both. One preferred embodiment contains from about 30 weight percent to about 97 weight percent diethylene glycol butyl ether (DB), from about 1 weight percent to about 7 weight percent of a quaternary ammonium hydroxide, and from about 1 weight percent to about 75 weight percent of an alkanolamine. The preferred quaternary groups are (C1-C8) alkyl, benzyl, arylalkyl, (C1-C5) alcohol, and combinations thereof. Particularly preferred quaternary ammonium hydroxides include tetramethylammonium hydroxide (TMAH), tetraethylammonium hydroxide (TEAH), ethyltrimethylammonium hydroxide (ETMAH), choline hydroxide and dimethyldipropylammonium hydroxide. Preferred alkanolamines include monoethanolamine (MEA) and (2-(2-aminoethoxy)ethanol) (AEE). The composition is essentially free of DMSO. A further embodiment according to this present disclosure contains an additional or secondary solvent. Preferred secondary solvents include glycols, glycol ethers, polyhydroxyl compounds, and the like.

Another embodiment according to this present disclosure contains DB, a quaternary ammonium hydroxide, water, and corrosion inhibitor. This embodiment is essentially free of alkanolamine, a secondary solvent, and DMSO.

A second aspect of the present disclosure provides for methods of using the novel stripper solutions described above to remove photoresist and related polymeric materials from a substrate. A photoresist can be removed from a selected substrate having a photoresist thereon by contacting the substrate with a stripping solution for a time sufficient to remove the desired amount of photoresist, by removing the substrate from the stripping solution, rinsing the stripping solution from the substrate with DI water or a solvent and drying the substrate.

A third aspect of the present disclosure includes electronic devices manufactured by the novel method disclosed.

Other features and advantages of the present invention will be apparent from the following more detailed description, taken in conjunction with the accompanying drawings which illustrate, by way of example, the principles of the invention.

DETAILED DESCRIPTION OF THE INVENTION

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

In an embodiment, compositions according to this present disclosure include diethylene glycol butyl ether (DB) solvent, a quaternary ammonium hydroxide, water, a corrosion inhibitor, and a secondary solvent or an alkanolamine having at least two carbon atoms, at least one amino substituent and at least one hydroxyl substituent, the amino and hydroxyl substituents attached to two different carbon atoms. Preferred quaternary substituents include (C1-C8) alkyl, benzyl and combinations thereof. Formulations having increased levels of an alkanolamine have the advantage of being particularly noncorrosive to carbon steel and are less injurious to typical waste treatments systems and auxiliary equipment than other stripper solutions. In some embodiments, the formulations may additionally include a secondary solvent. In one embodiment, the formulations may contain from about 0.2 weight percent to about 75 weight percent of a secondary solvent. Particularly useful secondary solvents include glycols, glycol ethers, and polyhydroxyl compounds described in more detail below. In some embodiments, the secondary solvent includes 3-methoxy-3-methyl-1-butanol (MMB) or propylene glycol (PG). Particularly suitable formulations have freezing points sufficiently below 0° C. to minimize solidification during transportation and warehousing. More preferred formulations have freezing points below about −10° C., below about −15° C., or below about −19° C. Preferred formulations have flashpoints sufficiently above 90° C. to minimize flammability hazards during use. More preferred formulations have flashpoints above about 95° C., above about 97° C., above about 99° C., or above about 100° C. Because the preferred stripper solutions remain liquid at low temperatures, the need to liquefy solidified drums of stripper solution received during cold weather or stored in unheated warehouses before the solution can be used is eliminated or minimized. The use of drum heaters to melt solidified stripper solution is time consuming, requires extra handling and can result in incomplete melting and modification of the melted solution's composition. In some embodiments, the compositions are free or essentially free of dimethyl sulfoxide (DMSO). In some embodiments, the composition may be free or essentially free of an alkanolamine. In some embodiments, the composition may be free or essentially free of a secondary solvent.

In an alternate embodiment, compositions according to this present disclosure include a solvent other than or in addition to DB such as diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, a quaternary ammonium hydroxide, water, a corrosion inhibitor, and a secondary solvent or an alkanolamine having at least two carbon atoms, at least one amino substituent and at least one hydroxyl substituent, the amino and hydroxyl substituents attached to two different carbon atoms.

Additionally, compositions according to the present disclosure display high loading capacities enabling the composition to remove higher levels of photoresists without the precipitation of solids. The loading capacity is defined as the number of cm3 of photoresist or bilayer material that can be removed for each liter of stripper solution before material is re-deposited on the wafer or before residue remains on the wafer. For example, if 20 liters of a stripper solution can remove 300 cm3 of photoresist before either redeposition occurs or residue remains on the wafer, the loading capacity is 300 cm3/20 liters=15 cm3/liter.

The compositions according to the present disclosure display good compatibility with polymeric dielectric materials such as polyimide (PI) and polybenzoxazole (PBO). Good compatibility is evidenced by low etch rates. The compositions of the present disclosure may display good compatibility with PI, or good compatibility with PBO, or good compatibility with both PI and PBO. The etch rate for PI may be less than about 20 nm/min, or less than about 10 nm/min, or less than about 5 nm/min, or less than about 3 nm/min, or less than about 2 nm/min, or less than about 1 nm/min. Alternatively, the etch rate for PBO may less than about 20 nm/min, or less than about 10 nm/min, or less than about 5 nm/min, or less than about 3 nm/min, or less than about 2 nm/min, or less than about 1 nm/min. Additionally, the etch rate for PI and PBO may both be less than about 20 nm/min, less than about 10 nm/min, less than about 5 nm/min, or less than about 3 nm/min, or less than about 2 nm/min, or less than about 1 nm/min.

The weight percent of the diethylene glycol butyl ether (DB) in the compositions of this invention may be from about 30 weight percent to about 97 weight percent. In other embodiments, the compositions may contain from about 40 weight percent to about 97 weight percent, from about 50 weight percent to about 97 weight percent of DB, or from about 60 weight percent to about 97 weight percent of DB. In some embodiments, the compositions contain greater than about 30 weight percent, greater than about 40 weight percent, greater than about 50 weight percent, or greater than about 60 weight percent of DB. Any of the just described amounts in the prior three sentences can be used as endpoints in any combination to describe the weight percent DB in the compositions of this invention, for example, about 30 to about 60 wt % DB. In another embodiment, a ratio of the amount of DB to the amount of water in the solutions is greater than about 5, greater than about 9, greater than about 10, greater than about 15, greater than about 20, greater than about 50, greater than about 100, greater than about 1000, and/or greater than about 3000. In another embodiment, a ratio of the amount of DB to the amount of water is from about 5 to about 10,000, or from about 9 to about 10,000, or from about 10 to about 10,000, or from about 15 to about 10,000, or from about 5 to about 6,000 or from about 9 to about 6,000, or from about 10 to about 6,000, or from about 15 to about 6,000. Any of the just described amounts in the prior two sentences can be used as endpoints in any combination to describe the ratio of the amount of DB to the amount of water in the compositions of this invention, for example, about 50 to about 6000.

The sum of the weight percent of the diethylene glycol butyl ether (DB) and the weight percent of the alkanolamine in the compositions of this invention may be from about 55 weight percent to about 97 weight percent. In other embodiments, the compositions may contain from about 55 weight percent to about 95 weight percent, from about 65 weight percent to about 95 weight percent, from about 70 weight percent to about 97 weight percent, from about 75 weight percent to about 95 weight percent, from about 80 weight percent to about 97 weight percent, from about 85 weight percent to about 97 weight percent, from about 85 weight percent to about 95 weight percent, from about 90 weight percent to about 97 weight percent, from about 75 weight percent to about 90 weight percent, from about 75 weight percent to about 85 weight percent of diethylene glycol butyl ether (DB) and the alkanolamine. Any of the just described amounts in the prior two sentences can be used as endpoints in any combination to describe the weight percent DB and alkanolamine in the compositions of this invention, for example, about 95 to about 97 wt % DB and alkanolamine. In some embodiments, the weight percent diethylene glycol butyl ether (DB) is greater than the weight percent alkanolamine, and the diethylene glycol butyl ether (DB) may be present in the composition at an amount from about 20% to about 90%, from about 20% to about 40%, from about 70% to about 90%, from about 10% to about 50%, from about 40% to about 90%, or from about 30% to about 90% more than the amount of alkanolamine present. In some embodiments, the diethylene glycol butyl ether (DB) may be present in the composition at an amount greater than about 20%, greater than about 30%, greater than about 35%, greater than about 40%, greater than about 50%, greater than about 70%, greater than about 75%, greater than about 80%, or greater than about 85% more than the amount of alkanolamine present. Any of the just described amounts in the prior sentence can be used as endpoints in any combination to describe a range, for example, about 30% to about 75% more than the amount of the alkanolamine present.

In other compositions, the weight percent diethylene glycol butyl ether (DB) is less than the weight percent alkanolamine, and the diethylene glycol butyl ether (DB) may be present in the composition at an amount from 5% to about 30%, from 10% to about 30%, from 10% to about 25%, or from 10% to about 20% less than the amount of alkanolamine present.

In some embodiments, the weight percent alkanolamine may be from about 1 weight percent to about 75 weight percent, about 2 weight percent to about 70 weight percent, about 2 weight percent to about 60 weight percent, about 2 weight percent to about 50 weight percent, about 2 weight percent to about 40 weight percent, about 3 weight percent to about 65 weight percent, about 3 weight percent to about 60 weight percent, about 3 weight percent to about 50 weight percent, about 3 weight percent to about 40 weight percent, about 4 weight percent to about 60 weight percent, about 4 weight percent to about 50 weight percent, about 4 weight percent to about 40 weight percent, about 7 weight percent to about 50 weight percent, about 10 weight percent to about 50 weight percent, about 10 weight percent to about 40 weight percent, about 15 weight percent to about 35 weight percent, about 20 weight percent to about 50 weight percent, about 20 weight percent to about 40 weight percent, about 1 weight percent to about 10 weight percent, about 2 weight percent to about 10 weight percent, or about 3 weight percent to about 10 weight percent.

The compositions may comprise from about 0.1 weight percent to about 10 weight percent, from 0.2 weight percent to about 8 weight percent, from 0.3 weight percent to about 6 weight percent, from 0.5 weight percent to about 5 weight percent, from 1 weight percent to about 4 weight percent, from about 1 weight percent to about 6 weight percent, from about 1 weight percent to 7 weight percent, from about 0.1 weight percent to about 6 weight percent, or from about 1 weight percent to about 5 weight percent of the quaternary ammonium hydroxide. Preferred quaternary substituents include (C1-C8) alkyl, benzyl, arylalkyl, (C1-C5) alcohol, and combinations thereof. In some embodiments, the quaternary ammonium hydroxide may include tetramethylammonium hydroxide (TMAH), tetraethylammonium hydroxide (TEAH), ethyltrimethylammonium hydroxide (ETMAH), dimethyldipropylammonium hydroxide (DMDPAH), and/or choline hydroxide (CH). In some embodiments, the quaternary ammonium hydroxide may be free or essentially free of tetramethylammonium hydroxide (TMAH).

When used, a secondary solvent may comprise from about 1 weight percent to about 75 weight percent, from about 5 weight percent to about 30 weight percent, from about 0.2 weight percent to about 35 weight percent, from about 0.2 weight percent to about 30 weight percent, from about 0.2 weight percent to about 25 weight percent, from about 0.2 weight percent to about 20 weight percent, from about 0.2 weight percent to about 15 weight percent, from about 0.2 weight percent to about 12 weight percent, from about 5 weight percent to about 12 weight percent, or from about 5 weight percent to about 15 weight percent of the composition. The stripping formulations can also contain an optional surfactant, typically at levels in the range of about 0.01 weight percent to about 3 weight percent. Because some of the stripper solution's components may be provided as aqueous solutions, the composition may additionally contain water. When present, water may comprise from about 0.01 weight percent to about 50 weight percent, from about 0.01 weight percent to about 40 weight percent, from about 0.01 weight percent to about 30 weight percent, from about 0.01 weight percent to about 25 weight percent, from about 0.01 weight percent to about 20 weight percent, from about 0.01 weight percent to about 15 weight percent, from about 0.01 weight percent to about 10 weight percent, from about 0.01 weight percent to about 7 weight percent, from about 0.01 weight percent to about 5 weight percent, from about 0.01 weight percent to about 3 weight percent, from about 0.01 weight percent to about 1 weight percent, from about 0.1 weight percent to about 20 weight percent, from about 0.1 weight percent to about 10 weight percent, from about 0.1 weight percent to about 7 weight percent, from about 1 weight percent to about 15 weight percent, from about 1 weight percent to about 7 weight percent, from about 2 weight percent to about 10 weight percent, from about 2 weight percent to about 7 weight percent, from about 3 weight percent to about 10 weight percent, from about 3 weight percent to about 7 weight percent, from about 0.001 weight percent to about 7 weight percent, from about 0.001 weight percent to about 10 weight percent, from about 1 weight percent to about 10 weight percent, of the composition. In other embodiments, water may comprise less than 50 weight percent, less than 40 weight percent, less than 30 weight percent, less than 25 weight percent, less than 20 weight percent, less than 15 weight percent, less than 10 weight percent, less than 7 weight percent, less than 5 weight percent, less than 3 weight percent, or less than 1 weight percent of the compositions.

Suitable alkanolamines have at least two carbon atoms and have the amino and hydroxyl substituents on different carbon atoms. Suitable alkanolamines include, but are not limited to, ethanolamine, N-methylethanolamine, N-ethylethanolamine, N-propylethanolamine, N-butylethanolamine, dimethylethanolamine, diethylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-1,3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, 2-(2-aminoethoxy)ethanol, 4-(2-hydroxyethyl)morpholine, 1-(2-hydroxyethyl)piperidine, and 1-(2-hydroxyethyl)piperazine.

The secondary solvent can include an alcohol, glycol ether, glycol, or a polyhydroxyl compound, or a combination of two or more of these.

The preferred secondary solvent alcohols, glycol ethers, glycols, and polyhydroxyl compounds do not contain ester or amine groups. The alcohol, glycol ether, glycol, or polyhydroxyl compounds can be aliphatic, alicyclic, cyclic, or aromatic, but is desirably aliphatic or alicyclic. The alcohol, glycol ether, glycol, or polyhydroxyl compound can be saturated or unsaturated, and desirably has one or less unsaturated bonds, or no unsaturated bonds. The alcohol, glycol ether, glycol, and polyhydroxyl compounds desirably do not contain a heteroatom. The alcohol, glycol ether, glycol, and polyhydroxyl compounds desirably contain only carbon, oxygen, and hydrogen atoms.

As examples of secondary solvent alcohols can be mentioned linear and branched chain and aromatic alcohols. To illustrate an alcohol of the solution can include methanol, ethanol, propanol, isopropyl alcohol, butanol, tert-butyl alcohol, tert-amyl alcohol, 3-methyl-3-pentanol, 1-octanol, 1-decanol, 1-undecanol, 1-dodecanol, 1-tridecanol, 1-tetradecanol, 1-pentadecanol, 1-hexadecanol, 9-hexadecen-1-ol, 1-heptadecanol, 1-octadecanol, 1-nonadecanol, 1-eicosanol, 1-heneicosanol, 1-docosanol, 13-docosen-1-ol, 1-tetracosanol, 1-hexacosanol, 1-heptacosanol, 1-octacosanol, 1-triacontanol, 1-dotriacontanol, 1-tetratriacontanol, cetearyl alcohol, furfurylalcohol, tetrahydrofurfuryl alcohol. In an illustrative example, the solution can include one or more of furfurylalcohol, tetrahydrofurfuryl alcohol, tert-butyl alcohol, or 3-methyl-3-pentanol.

As mentioned above, the secondary solvent can be a polyhydroxyl compound having two or more hydroxyl groups. The polyhydroxyl compound desirably has a molecular weight of no more than 500, or no more than 400, or no more than 350, or no more than 300, or no more than 275, or no more than 250, or no more than 225, or no more than 200, or no more than 175, or no more than 150, or no more than 125, or no more than 100, or no more than 75.

The polyhydroxyl compound as a secondary solvent can include, ethylene glycol; 1,2-propanediol (propylene glycol); 1,3-propanediol, 1,2,3-propanetriol; 1,2-butanediol; 1,3-propanediol; 2,3-butanediol; 1,4-butanediol; 1,2,3-butanetriol; 1,2,4-butanetriol; 1,2-pentanediol; 1,3-pentanediol; 1,4-pentandiol; 2,3-pentanediol; 2,4-pentandiol; 3,4-pentanediol; 1,2,3-pentanetriol; 1,2,4-pentanetriol; 1,2,5-pentanetriol; 1,3,5-pentanetriol; etohexadiol; p-methane-3,8-polyhydroxyl compound; 2-methyl-2,4-pentanediol; 2,2-dimethyl-1,3-propanediol; glycerin; trirnethylolpropane; xylitol; arabitol, 1,2- or 1,3-cyclopentanediol; 1,2- or 1,3-cyclohexanediol; 2,3-norbornanediol; 1,8-octanediol; 1,2-cyclohexane-dimethanol; 1,3-cyclohexanedimethanol; 1,4-cyclohexanedimethanol; 2,2,4-trimethyl-1,3-pentanediol; hydroxypivalyl hydroxypivalate; 2-methyl-1,3-propanediol; 2-butyl-2-ethyl-1,3-propanediol; 2-ethyl-2-isobutyl-1,3-propanediol; 1,6-hexanediol; 2,2,4,4-tetramethyl-1,6-hexanediol; 1,10-decanediol; 1,4-benzenedimethanol; hydrogenated bisphenol A; 1,1,1-trimethylol propane; 1,1, 1-trimethylolethane; pentaerythritol; erythritol; threitol; dipentaerythritol; sorbitol; glycerol; xylitol; and the like, and combinations of 2 or more of the aforementioned polyhydroxyl compounds and polyhydroxyl compound.

In an illustrative example, the solution can include one or more of the secondary polyhydroxyl solvents of ethylene glycol, 1,2-propanediol (propylene glycol), 1,3-propanediol, 1,4-pentanediol, 1,2-butanediol, or 1,3-butanediol.

The glycol ether compound as a secondary solvent can include, 3-methoxy-3-methyl-1-butanol, diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, or diethylene glycol diethyl ether.

The compositions can also optionally contain one or more corrosion inhibitors. Suitable corrosion inhibitors include, but are not limited to, aromatic hydroxyl compounds such as catechol and resorcinol; alkylcatechols such as methylcatechol, ethylcatechol and t-butylcatechol, phenols and pyrogallol; aromatic triazoles such as benzotriazole; alkylbenzotriazoles; sugar alcohols such as glycerol, sorbitol, erythritol, xylitol; carboxylic acids such as formic acid, acetic acid, propionic acid, butyric acid, isobutyric acid, oxalic acid, malonic acid, succinic acid, sebacic acid, dodecanoic acid, undecanoic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; metal salts such as a hydrate of copper (II) nitrate such as copper (II) nitrate hemi(pentahydrate); organic salts of carboxyl containing organic containing compounds described above, basic substances such as trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime. A single corrosion inhibitor may be used, or a combination of corrosion inhibitors may be used. Corrosion inhibitors have proven useful at levels ranging from about 1 ppm to about 10%. In some embodiments, the solution may contain about 0.001 weight percent to about 3 weight percent of a first corrosion inhibitor. In an embodiment, the first corrosion inhibitor is a hydrate of copper (II) nitrate. In some embodiments, the solution may additionally contain about 0.05 weight percent to about 7 weight percent of a second corrosion inhibitor. In other embodiments, the solution may contain about 0.001 weight percent to about 2 weight percent, about 0.001 weight percent to about 1 weight percent, 0.001 weight percent to about 0.1 weight percent, about 0.01 weight percent to about 3 weight percent, about 0.01 weight percent to about 2 weight percent, about 0.01 weight percent to about 1 weight percent, at least 0.001 weight percent, at least 0.01 weight percent, at least 0.1 weight percent, less than about 0.05 weight percent, less than about 0.1 weight percent, less than about 0.5 weight percent, less than about 1 weight percent, less than about 2 weight percent, and/or less than about 3 weight percent of the first corrosion inhibitor. In other embodiments, the solution may contain about 0.05 weight percent to about 5 weight percent, about 0.05 weight percent to about 3 weight percent, about 0.05 weight percent to about 2 weight percent, about 0.05 weight percent to about 1 weight percent, about 0.1 weight percent to about 7 weight percent, about 0.1 weight percent to about 5 weight percent, about 0.1 weight percent to about 3 weight percent, about 0.1 weight percent to about 2 weight percent, about 0.1 weight percent to about 1 weight percent, at least 0.05 weight percent, at least 0.1 weight percent, at least 1 weight percent, less than 1 weight percent, less than 2 weight percent, less than about 3 weight percent, less than about 5 weight percent, and/or less than about 7 weight percent of the second corrosion inhibitor. The first and second corrosion inhibitors are not the same. Both the first corrosion inhibitor and the second corrosion inhibitor may be selected from the corrosion inhibitors described above. In some embodiments, the composition may be essentially free of a metal salt. In some embodiments, the composition may be essentially free of a sugar alcohol.

Preferred optional surfactants have included fluorosurfactants. One example of a preferred fluorosurfactant is DuPont FSO (fluorinated telomere B monoether with polyethylene glycol (50%), ethylene glycol (25%), 1,4-dioxane (<0.1%), water 25%). Another example of a preferred fluorosurfactant is DuPont, Capstone, FS-10, (30% perfluoroalkylsulfonic acid in water).

This invention further provides a method of removing at least one photoresist layer comprising the steps of: contacting a substrate comprising at least one photoresist layer with any of the stripper solutions of this invention at a temperature and for a time to at least partially remove said at least one photoresist layer; and rinsing said substrate after said contacting step. The contacting time will typically be between from 10 min to 120 min; however, it will depend on the layers, materials, residues being removed and the thickness(es) thereof, the temperature of the stripper solution, as well as the type of contacting step, such as, immersing, spraying or combination of both, and any relative motion between the substrate and the cleaning solution.

Preferred temperatures of at least 50° C. are preferred for contacting the substrate whereas for a majority of applications, temperatures of from about 50° C. to about 80° C. are more preferred. In another embodiment, the preferred temperature is at least 5° C. less than the flashpoint of the solution, or at least 10° C. less than the flashpoint of the solution, or at least 20° C. less than the flashpoint of the solution. Alternatively, the preferred temperature is less than 101° C., or is less than 96° C., or is less than 86° C. For particular applications where the substrate is either sensitive or longer removal times are required, lower contacting temperatures are appropriate. For example, when reworking substrates, it may be appropriate to maintain the stripper solution at a temperature of at least 20° C. for a longer time to remove the photoresist and avoid damaging to the substrate.

When immersing a substrate, agitation of the composition additionally facilitates photoresist removal. Agitation can be affected by mechanical stirring, circulating, or by bubbling an inert gas through the composition. Upon removal of the desired amount of photoresist, the substrate is removed from contact with the stripper solution and rinsed with water or an alcohol or an aqueous alcohol solution. DI water is a preferred form of water and isopropanol is a preferred alcohol. For substrates having components subject to oxidation, rinsing is preferably done under an inert atmosphere. The preferred stripper solutions according to the present disclosure have improved loading capacities for photoresist materials compared to current commercial products and are able to process a larger number of substrates with a given volume of stripper solution.

The stripper solutions provided in this disclosure can be used to remove positive or negative polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers.

The formulations are useful to remove positive and negative resists, preferably positive resists, of any thickness, that may be thin or thick resists. The resists may be of a thickness ranging from 1 μm to 150 μm, or 1 μm to 100 μm, or 2 μm to 70 μm or 10 μm to 100 μm. Examples of positive photoresists include AZ® 6130 from AZ Electronic Materials, and TOK PC0421, TOK PW1000 and TOK CR4000 from Tokyo Ohka Kogyo. An example of a negative photoresist that may be removed using the compositions of this invention includes JSR-THB photoresists from JSR Micro. Typical positive resist is composed of novalac resin and photoacid generator. Typical negative resist is composed of multifunctional acrylate, acrylic resin and photosensitizer.

This disclosure describes chemical solutions used for removal of thick photoresist in advanced packaging applications for semiconductor devices. In one embodiment, the solutions described contain diethylene glycol butyl ether (DB), alkanolamine and/or secondary solvent, water, quaternary ammonium hydroxide, and at least one corrosion inhibitor. The solution is essentially free of DMSO. In some embodiments the alkanolamine is monoethanolamine or 2-(2-aminoethoxy)ethanol. In some embodiments the secondary solvent is 3-methyl-3-methoxy-1-butanol or propylene glycol. In some embodiments the quaternary ammonium hydroxide may be TMAH, TEAH, ETMAH, choline hydroxide or dimethyldipropylammonium hydroxide. By essentially free it is meant an amount less than 1 percent, alternately less than 0.1 percent, alternately less than 0.01 percent or less than 0.001 percent. Essentially free of also includes free of which is no DMSO is present. The solutions also optionally contain a surfactant. The solutions contain less than about 10 weight percent water. In an embodiment, the solutions contain between about 0.001 weight percent to about 10 weight percent water. In some embodiments, the compositions may be essentially free of alkanolamine or secondary solvent or both alkanolamine and secondary solvent.

Some embodiments of the compositions of the invention may be essentially free of, alternatively free of (as those terms were defined earlier) one or more than one of the following: nitrogen containing solvents, bis-choline salts, tri-choline salts, oxoammonium compounds, hydroxylamines and derivatives thereof, methyldiethanolamines, aminoethylethanolamines, hydrogen peroxide, oxidants, inorganic acids, organic acids, acids, inorganic bases, potassium hydroxide, pyrazole, metal hydroxides, glycols, polyols, NMP, surfactants, metal-containing compounds, sugar alcohols and aromatic hydroxyl compounds, fluorine-, bromine-, chlorine- or iodine-containing compounds; phosphorus-containing compounds, sodium, calcium and abrasive materials and combinations of any of the them.

For the experiments described below, resist removal was observed and noted accordingly. Resist removal is defined as "clean" if all resist was removed from the wafer coupon surface; as "mostly clean" if at least 95% of the resist, but not all of the resist, was removed from the surface; and "partly clean" if at least about 80% of the resist, but less than 95% of the resist, was removed from the surface.

The following abbreviations are used in the various compositions listed below: DB=diethylene glycol butyl ether; DMSO=dimethyl sulfoxide; MEA=monoethanolamine; MMB=3-methoxy 3-methyl-1-butanol; TMAH=tetramethylammonium hydroxide; TEAH=tetraethylammonium hydroxide; DMDPAH=dimethyldipropylammonium hydroxide; AEE=2-(2-aminoethoxy)ethanol.

Table 1 lists various inventive and comparative stripping compositions.

TABLE 1

Formulations
(All percentages are weight percent,
based on the total weight of the formulation)

| Formulation 1 | Formulation 2 | Formulation 3 | Formulation 4 |
| --- | --- | --- | --- |
| 92.475% DB solvent | 65.975% DB solvent | 53.825% DB solvent | 65.115% DB solvent |
| 4.5% MEA | 30% MEA | 30% MEA | 30% MEA |

TABLE 1-continued

Formulations
(All percentages are weight percent,
based on the total weight of the formulation)

| 1.5% TMAH | 2.0% TMAH | 3.23% DMDPAH | 2.28% choline hydroxide |
|---|---|---|---|
| 1.515% water | 2.015% water | 12.92% propylene glycol | 2.595% water |
| 0.010% copper (II) nitrate hemi (pentahydrate) | 0.010% copper (II) nitrate hemi (pentahydrate) | 0.015% water | 0.010% copper (II) nitrate hemi (pentahydrate) |
| | | 0.010% copper (II) nitrate hemi (pentahydrate) | |

| Formulation 5 | Formulation 6 | Formulation 7 | Formulation 8 |
|---|---|---|---|
| 59.775% DB solvent | 60.895% DB solvent | 84.895% DB solvent | 77.825% DB solvent |
| 30% MEA | 30% MEA | 6% MEA | 6% MEA |
| 3.22% TEAH | 3.232% DMDPAH | 3.232% DMDPAH | 3.23% DMDPAH |
| 5.995% water | 4.863% water | 4.863% water | 12.92% propylene glycol |
| 1% sorbitol | 1% sorbitol | 1% sorbitol | 0.015% water |
| 0.010% copper (II) nitrate hemi (pentahydrate) | 0.010% copper (II) nitrate hemi (pentahydrate) | 0.010% copper (II) nitrate hemi (pentahydrate) | 0.010% copper (II) nitrate hemi (pentahydrate) |

| Formulation 9 | Formulation 10 | Formulation 11 | Formulation 12 |
|---|---|---|---|
| 89.475% DB solvent | 83.975% DB solvent | 93.975% DB solvent | 86.975% DB solvent |
| 4.5% AEE | 10% MMB | 1.5% TMAH | 10% MMB |
| 1.5% TMAH | 1.5% TMAH | 4.515% water | 1.5% TMAH |
| 4.515% water | 4.515% water | 0.010% copper (II) nitrate hemi (pentahydrate) | 1.515% water |
| 0.010% copper (II) nitrate hemi (pentahydrate) | 0.010% copper (II) nitrate hemi (pentahydrate) | | 0.010% copper (II) nitrate hemi (pentahydrate) |

| Formulation 13 | Formulation 14 |
|---|---|
| 92.475% DB solvent | 96.975% DB solvent |
| 4.5% AEE | 1.5% TMAH |
| 1.5% TMAH | 1.515% water |
| 1.515% water | 0.010% copper (II) nitrate hemi(pentahydrate) |
| 0.010% copper (II) nitrate hemi(pentahydrate) | |

| Comparative Formulation 1 | Comparative Formulation 2 |
|---|---|
| 65.575% DMSO | 59.975% DMSO |
| 30% MEA | 30% MEA |
| 1.8% TMAH | 2% TMAH |
| 1.815% water | 6.015% water |
| 0.8% sorbitol | 2% sorbitol |
| 0.010% copper (II) nitrate hemi(pentahydrate) | 0.010% copper (II) nitrate hemi(pentahydrate) |

Example 1

Table 2 lists stripping compositions that were tested for Example 1 using an immersion process and semiconductor wafers with 60 µm-70 µm thick JSR THB-151N negative spin-on photoresist with plated Cu pillars with Sn/Ag solder caps. For the immersion process, coupon-sized samples of semiconductor wafers were processed in beakers. Beakers were filled with 100 mL of a stripping composition and heated to the target temperature of 70° C. When the stripping composition was at the target temperature, a coupon was placed in a holder in the beaker, and slight agitation was provided by a stir bar. Temperature was maintained at the target temperature of 70° C. throughout the process. After a total processing time of 15 minutes, the coupons were removed from the beaker, rinsed with DI water and IPA, and dried with a stream of air. The process temperature for all compositions in Table 1 was 70° C.

For the experiments described above, resist removal was observed and noted accordingly. Resist removal is defined as "clean" if all resist was removed from the wafer coupon surface; as "mostly clean" if at least 95% of the resist was removed from the surface; "partly clean" if about 80% of the resist was removed from the surface. Formulation 1 with DB solvent and only 4.5% MEA was not able to completely remove the negative resist. All the other tested formulations contained 30% MEA and were able to completely remove the negative resist.

TABLE 2

Resist removal results for Cu pillar wafer

| Formulation | Resist Removal for Cu Pillar Wafer |
|---|---|
| 1 | Partly clean |
| 2 | Clean |
| 3 | Clean |
| 4 | Clean |
| 5 | Clean |
| 6 | Clean |
| Comparative 1 | Clean |
| Comparative 2 | Clean |

Example 2

Table 3 lists stripping compositions that were tested for Example 2 using an immersion process and semiconductor wafers with patterned positive photoresist that had been treated by a plasma dry etch. For the immersion process, coupon-sized samples of semiconductor wafers were processed in beakers. Beakers were filled with 100 mL of a stripping composition and heated to the target temperature of 60° C. When the stripping composition was at the target temperature, a coupon was placed in a holder in the beaker, and slight agitation was provided by a stir bar. Temperature was maintained at the target temperature of 60° C. throughout the process. After a total processing time of 15 minutes, the coupons were removed from the beaker, rinsed with DI water and IPA, and dried with a stream of air. The process temperature for all compositions in Table 3 was 60° C.

For the experiments described above, resist removal was observed and noted accordingly. Resist removal is defined as "clean" if all resist was removed from the wafer coupon surface; as "mostly clean" if at least 95% of the resist was removed from the surface; "partly clean" if about 80% of the resist was removed from the surface. All the formulations that were tested completely removed the plasma-treated positive resist.

TABLE 3

Resist removal results for positive
resist after dry etch

| Formulation | Resist Removal for Cu Pillar Wafer |
|---|---|
| 1 | Clean |
| 9 | Clean |
| 10 | Clean |
| 11 | Clean |
| 12 | Clean |
| 13 | Clean |
| 14 | Clean |

Example 3

Table 4 lists stripping compositions that were tested for Example 3 using an immersion process to measure etch rates of cured polyimide (PI) films and cured polybenzoxazole (PBO) films. Testing was performed using semiconductor wafers coated with cured blanket PI films or cured blanket PBO films. For the immersion process, coupon-sized samples of semiconductor wafers were processed in beakers. Beakers were filled with 100 mL of a stripping composition and heated to the target temperature of 60° C. When the stripping composition was at the target temperature, a coupon was placed in a holder in the beaker, and slight agitation was provided by a stir bar. Temperature was maintained at the target temperature of 60° C. throughout the process. After a total processing time of 60 minutes, the coupons were removed from the beaker, rinsed with DI water and IPA, and dried with a stream of air.

The thickness of the polyimide films was measured before and after processing for each coupon that was tested. The thickness for each coupon was the average from two spots. Thickness change was used to calculate the average etch rate. Factors affecting PI and PBO compatibility include solvent, alkanolamine, and water level. Formulations 9 and Comparative Formulation 2 with water>3% exhibited the lowest etch rates for PBO. Comparative Formulations 1 and 2 with DMSO exhibited the highest etch rates for PI. Formulation 1 with 4.5% MEA had a lower etch rate for PI than Formulation 2 with 30% MEA. Only Formulation 9 had low etch rates for both PI and PBO due to the use of DB solvent, AEE, and >3% water.

TABLE 4

PI and PBO etch rates at 60° C.

| Formulation | Cured PI Etch Rate | Cured PBO Etch Rate |
|---|---|---|
| 1 | <1 nm/min | 11.2 nm/min |
| 2 | 11.3 nm/min | 7.9 nm/min |
| 9 | 1.6 nm/min | 0.7 nm/min |
| Comparative 1 | 26.7 nm/min | 6.4 nm/min |
| Comparative 2 | 36.0 nm/min | 2.2 nm/min |

Example 4

Table 5 lists stripping compositions that were tested for Example 4 using an immersion process to observe compatibility with patterned films of low-temperature cured PI. Testing was performed using semiconductor wafers coated with patterned low-temperature cured PI films. For the immersion process, coupon-sized samples of semiconductor wafers were processed in beakers. Beakers were filled with 100 mL of a stripping composition and heated to the target temperature of 60° C. When the stripping composition was at the target temperature, a coupon was placed in a holder in the beaker, and slight agitation was provided by a stir bar. Temperature was maintained at the target temperature of 60° C. throughout the process. After the given processing time, the coupons were removed from the beaker, rinsed with DI water and IPA, and dried with a stream of air.

The patterned PI films were observed by optical microscopy before and after immersion processing. Observations were recorded as "no change" if there was no observable difference in the appearance of the patterned PI film after processing compared to observations made before processing. Observations were recorded as "cracks formed" if cracks in the patterned PI film were observed after processing that were not present before processing. The formation of cracks was indicative of the formulation degrading the PI film.

Formulation 1 was the only formulation that resulted in the formation of cracks in the patterned PI film. Formulation 1 was the only formulation tested for Example 4 that contained MEA, indicating MEA can reduce compatibility with low-temperature cured PI.

TABLE 5

Compatibility with patterned low-temperature cured PI at 60° C.

| Formulation | Time | Compatibility Observation |
|---|---|---|
| 1 | 30 min | Cracks Formed |
| 9 | 50 min | No Change |
| 10 | 50 min | No Change |
| 11 | 50 min | No Change |
| 12 | 50 min | No Change |
| 13 | 50 min | No Change |
| 14 | 50 min | No Change |

Example 5

Table 6 lists the flash point of various formulations.

TABLE 6

Flashpoints

| Formulation | Flashpoint (° C.) |
|---|---|
| 1 | 106.5 |
| 2 | 99 |
| 9 | >100 |
| Comparative 1 | 96.5 |
| Comparative 2 | 89 |

Table 7 lists the freezing point of various formulations.

TABLE 7

Freezing points

| Formulation | Freezing point (° C.) |
|---|---|
| 1 | <−19 |
| 2 | <−19 |
| 9 | <−19 |

TABLE 7-continued

Freezing points

| Formulation | Freezing point (° C.) |
|---|---|
| Comparative 1 | 3 |
| Comparative 2 | −6 |

While the invention has been described with reference to one or more embodiments, it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified. Further, any use of "having", "comprising", "containing" or the like in the specification and in the claims include the more narrow descriptors: "consisting essentially of" and "consisting of" as if they were expressly written in the alternative following "having", "comprising", "containing" or the like. Additionally, the use of the articles "a" or "an" or "the" to describe any of the components of the stripper compositions shall be interpreted anywhere that they appear in the specifications and the claims as if they were replaced with "one or more than one". All percentages are by weight if not specified otherwise.

What is claimed is:

1. A stripper solution for removing photoresist from substrates comprising:
   about 30 weight percent to about 97 weight percent diethylene glycol butyl ether;
   about 1 weight percent to about 7 weight percent of quaternary ammonium hydroxide;
   about 1 weight percent to about 75 weight percent of (2-(2-aminoethoxy)ethanol) or (2-(2-aminoethoxy)ethanol) and secondary solvent;
   about 0.001 weight percent to about 7 weight percent of at least one corrosion inhibitor; and
   about 0.1 weight percent to about 20 weight percent water;
   wherein said at least one corrosion inhibitor is selected from the group consisting of resorcinol, glycerol, sorbitol, and copper (II) nitrate hemi(pentahydrate), and
   wherein the solution is essentially free of DMSO.

2. The solution of claim 1, wherein the quaternary ammonium hydroxide has substituents that are ($C_1$-$C_8$) alkyl, arylalkyl, benzyl, ($C_1$-$C_5$) alcohol, and combinations thereof.

3. The solution of claim 2, wherein the quaternary ammonium hydroxide includes at least one of tetramethylammonium hydroxide, tetraethylammonium hydroxide, ethyltrimethylammonium hydroxide, dimethyldipropylammonium hydroxide, or choline hydroxide.

4. The solution of claim 1, wherein the (2-(2-aminoethoxy)ethanol) is present in the amount of about 3 weight percent to about 50 weight percent.

5. The solution of claim 1, wherein the corrosion inhibitor is present in an amount of about 0.001 wt % to about 0.1 wt %.

6. The solution of claim 1, wherein the secondary solvent is present in the amount of about 5 weight percent to about 30 weight percent.

7. The solution of claim 6, wherein the secondary solvent includes 3-methoxy-3-methyl-1-butanol or propylene glycol.

8. The solution of claim 1,
   wherein the diethylene glycol butyl ether is present in the amount of about 50 weight percent to about 97 weight percent;
   wherein the quaternary ammonium hydroxide is present in the amount of about 1 weight percent to about 6 weight percent;
   wherein the (2-(2-aminoethoxy)ethanol) is present in the amount of about 3 weight percent to about 40 weight percent;
   wherein the water is present in the amount of about 0.1 weight percent to about 7 weight percent; and
   wherein said at least one corrosion inhibitor comprises a first corrosion inhibitor, said first corrosion inhibitor is present in the amount of about 0.001 weight percent to about 3 weight percent.

9. The solution of claim 8, wherein the first corrosion inhibitor is copper (II) nitrate hemi(pentahydrate).

10. The solution of claim 9, wherein the at least one corrosion inhibitor further comprises a second corrosion inhibitor that is selected from the group consisting of resorcinol, glycerol, and sorbitol.

11. The solution of claim 10, wherein the first corrosion inhibitor is present in an amount between about 0.001 weight percent to about 0.1 weight percent.

12. The solution of claim 1, wherein the corrosion inhibitor includes a first and a second corrosion inhibitor selected from the group consisting of resorcinol, glycerol, sorbitol, and copper (II) nitrate derivatives wherein said second corrosion inhibitor is different from said first corrosion inhibitor.

13. The solution of claim 12, further comprising about 0.05 weight percent to about 7 weight percent of said second corrosion inhibitor.

14. The solution of claim 1, wherein a ratio of the amount of the diethylene glycol butyl ether to the amount of the water is greater than about 10.

15. The solution of claim 1, wherein the freezing point is below about −15 degrees Celsius and the flashpoint is above about 97 degrees Celsius.

16. The solution of claim 1, wherein the freezing point is below about −19 degrees Celsius.

17. A stripper solution for removing photoresist from substrates comprising:
   about 50 weight percent to about 97 weight percent diethylene glycol butyl ether;
   about 1 weight percent to about 5 weight percent of quaternary ammonium hydroxide;
   about 3 weight percent to about 40 weight percent of (2-(2-aminoethoxy)ethanol);
   about 0.001 weight percent to about 1 weight percent of corrosion inhibitor; and
   about 1 weight percent to about 10 weight percent of water;
   wherein a ratio of the amount of diethylene glycol butyl ether to the amount of water is greater than about 5;
   wherein the solution exhibits a flash point above about 95 degrees Celsius; and
   wherein the solution is essentially free of DMSO.

18. The method of removing at least one photoresist layer comprising the steps of:

contacting a substrate comprising at least one photoresist layer with a stripper solution at a temperature and for a time to at least partially remove said at least one photoresist layer; and rinsing said substrate after said contacting step;

wherein said stripper solution comprises about 30 weight percent to about 97 weight percent diethylene glycol butyl ether;

about 1 weight percent to about 7 weight percent of quaternary ammonium hydroxide;

about 1 weight percent to about 75 weight percent of (2-(2-aminoethoxy)ethanol) or (2-(2-aminoethoxy)ethanol) and secondary solvent;

about 0.001 weight percent to about 7 weight percent of corrosion inhibitor; and about 0.1 weight percent to about 20 weight percent water; and wherein the solution is essentially free of DMSO.

19. The solution of claim 5, wherein a ratio of the weight percent of the diethylene glycol butyl ether to the weight percent of the water is greater than about 15.

20. The solution of claim 19, wherein a sum of the weight percent of the diethylene glycol butyl ether and the weight percent of the (2-(2-aminoethoxy)ethanol) is from about 70 to about 97 weight percent.

21. The solution of claim 20, wherein said solution is free of secondary solvent.

* * * * *